(12) United States Patent
Maekawa

(10) Patent No.: US 9,345,177 B2
(45) Date of Patent: May 17, 2016

(54) WIRELESS POWER SUPPLY SYSTEM

(71) Applicant: IHI Corporation, Tokyo (JP)

(72) Inventor: Yuji Maekawa, Tokyo (JP)

(73) Assignee: IHI CORPORATION (JP)

( * ) Notice: Subject to any disclaimer, the term of this patent is extended or adjusted under 35 U.S.C. 154(b) by 0 days.

(21) Appl. No.: 14/447,852

(22) Filed: Jul. 31, 2014

(65) Prior Publication Data

US 2014/0340035 A1 Nov. 20, 2014

Related U.S. Application Data

(63) Continuation of application No. PCT/JP2013/052671, filed on Feb. 6, 2013.

(30) Foreign Application Priority Data

Feb. 6, 2012 (JP) .................................. 2012-023440

(51) Int. Cl.
*H02J 7/00* (2006.01)
*H05K 9/00* (2006.01)
(Continued)

(52) U.S. Cl.
CPC ................ *H05K 9/00* (2013.01); *B60L 11/182* (2013.01); *B60L 11/1829* (2013.01); *B60L 11/1835* (2013.01); *H01F 27/365* (2013.01); *H01F 38/14* (2013.01); *H02J 5/005* (2013.01); *H02J 7/025* (2013.01); *B60L 2210/30* (2013.01); *B60L 2270/147* (2013.01); *B60M 7/003* (2013.01); *Y02T 10/7005* (2013.01); *Y02T 10/7072* (2013.01); *Y02T 10/7241* (2013.01);

(Continued)

(58) Field of Classification Search
CPC ........ H02J 7/025; H01F 38/14; Y02T 90/122; B60L 11/182; Y02E 60/12
USPC ........................................................... 320/108
See application file for complete search history.

(56) References Cited

U.S. PATENT DOCUMENTS

| 4,612,486 A * | 9/1986 | Ban ..................... H02K 29/12 310/113 |
| 5,710,502 A * | 1/1998 | Poumey ................ B60L 11/182 320/108 |

(Continued)

FOREIGN PATENT DOCUMENTS

| CN | 1802123 A | 7/2006 |
| DE | 102010020125 A1 | 11/2011 |

(Continued)

OTHER PUBLICATIONS

International Search Report and Written Opinion mailed May 14, 2013 in corresponding PCT International Application No. PCT/JP2013/052671.

(Continued)

*Primary Examiner* — Arun Williams
(74) *Attorney, Agent, or Firm* — Ostrolenk Faber LLP

(57) ABSTRACT

A wireless power supply system that wirelessly supplies electric power from a power-supplying coil to a power-receiving coil is provided with a ground power-supplying device having a power-supplying coil, a vehicle having a power-receiving coil, and a power-supplying and a power-receiving covers that shield leakage magnetic flux by covering the periphery of the power-supplying coil and the power-receiving coil and the periphery of space between the coils.

4 Claims, 3 Drawing Sheets

(51) Int. Cl.

| | | |
|---|---|---|
| *H01F 38/14* | (2006.01) | |
| *B60L 11/18* | (2006.01) | |
| *H02J 5/00* | (2016.01) | |
| *H02J 7/02* | (2016.01) | |
| *H01F 27/36* | (2006.01) | |
| *B60M 7/00* | (2006.01) | |

(52) U.S. Cl.
CPC ............... *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(56) References Cited

U.S. PATENT DOCUMENTS

| | | | | |
|---|---|---|---|---|
| 2011/0018498 | A1* | 1/2011 | Soar | B60N 2/44 320/108 |
| 2011/0181240 | A1* | 7/2011 | Baarman | B60L 11/182 320/108 |
| 2012/0256494 | A1* | 10/2012 | Kesler | H03H 7/40 307/104 |
| 2013/0038272 | A1* | 2/2013 | Sagata | B60L 11/182 320/106 |
| 2013/0181667 | A1* | 7/2013 | Takeshita | B60L 11/182 320/108 |

FOREIGN PATENT DOCUMENTS

| | | |
|---|---|---|
| EP | 2790294 A1 | 10/2014 |
| JP | 08-241386 | 9/1996 |
| JP | 2000-114077 | 4/2000 |
| JP | 2000-114078 | 4/2000 |
| JP | 2003-68544 | 3/2003 |
| JP | 2005-269857 | 9/2005 |
| JP | A-2008-54424 | 3/2008 |
| JP | A-2009-303316 | 12/2009 |
| JP | 2010-070048 | 4/2010 |
| JP | A-2010-098807 | 4/2010 |
| JP | 2012-014383 | 1/2012 |
| JP | A-2012-502610 | 1/2012 |
| JP | A-2012-196015 | 10/2012 |
| JP | 2012-228147 | 11/2012 |
| WO | WO 2010/026528 A2 | 3/2010 |
| WO | WO 2010/098412 A1 | 9/2010 |

OTHER PUBLICATIONS

Office Action dated Aug. 25, 2015 in corresponding Japanese Patent Application No. 2013-557535 (with English language translation)(16 total pages).

Extended European Search Report and Search Opinion dated Sep. 17, 2015 in corresponding European Patent Application No. 13746028.3 (6 total pages).

Chinese Office Action issued Dec. 3, 2015 in corresponding Application No. 201380007946.4.

* cited by examiner

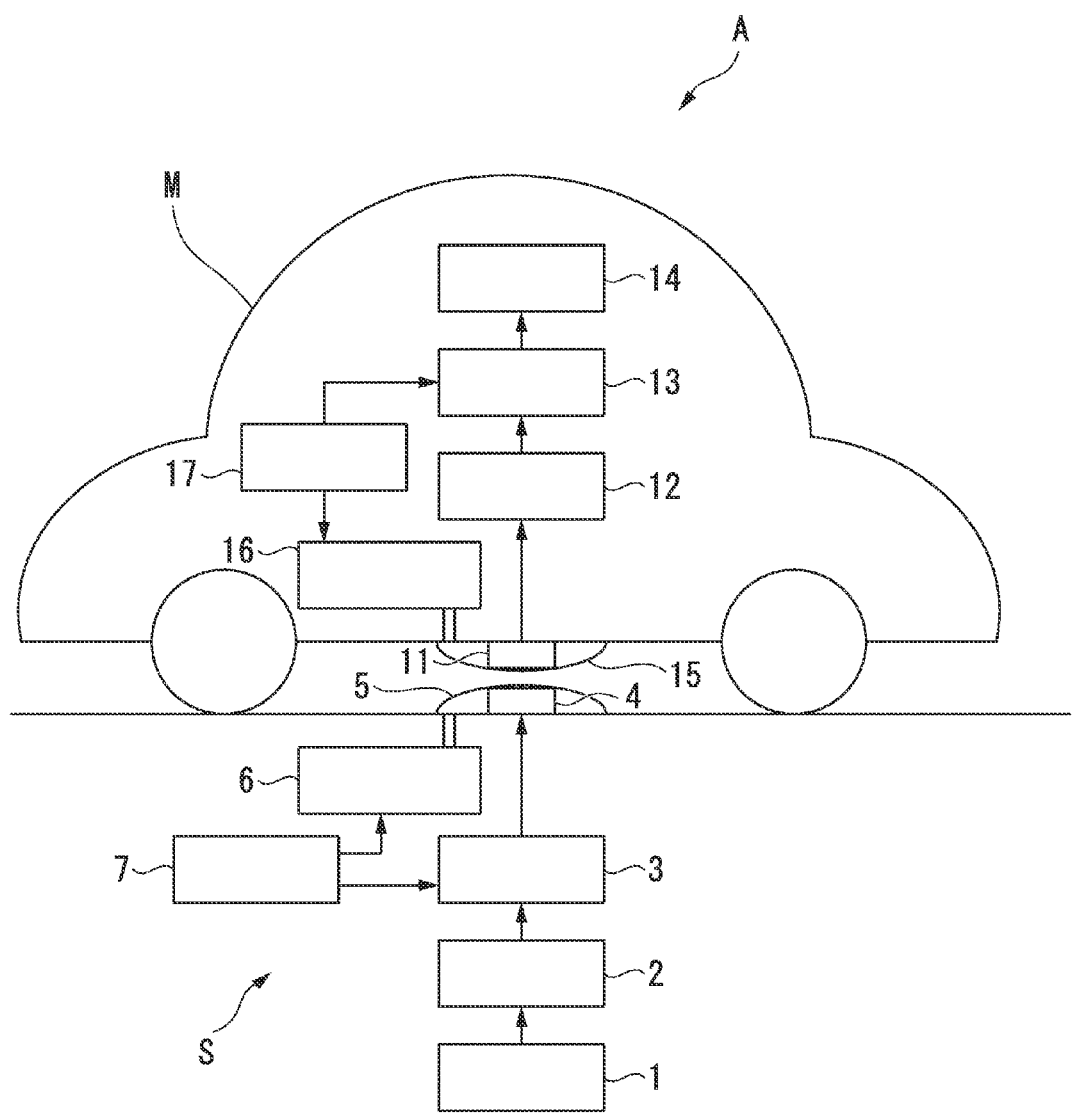

WIRELESS POWER SUPPLY SYSTEM

This application is a continuation application based on a PCT Patent Application No. PCT/JP2013/052671, filed Feb. 6, 2013, and priority is claimed on Japanese Patent Application No. 2012-23440, filed Feb. 6, 2012. The contents of both the PCT application and the Japanese Patent Application are incorporated herein by reference.

TECHNICAL FIELD

The present invention relates to a wireless power supply system.

BACKGROUND ART

In the following Patent document 1, a wireless power supply system that shields leakage magnetic flux generated around a power-receiving coil of an electric vehicle and around a power-supplying coil of a power-supplying device is disclosed. In the wireless power supply system, the power-receiving coil that has a cylindrical shape provided at the bottom of the electric vehicle in a posture in which the coil axis is in the up-and-down direction (in a vertical direction) in which only one end face of the power-receiving coil is exposed from the bottom, and a shield box that covers side faces and the other end face of the power-receiving coil is provided. On the other hand, the power-supplying coil that has a cylindrical shape having the same diameter as the power-receiving coil and that is buried in the ground so that one end face of the power-supplying coil faces the other end face of the power-receiving coil, and a shield box that covers side faces and the other end face of the power-supplying coil is provided in the power supplying-device.

DOCUMENT OF RELATED ART

Patent Documents

[Patent document 1] Japanese Unexamined Patent Application Publication (JP-A) No. 2010-70048

SUMMARY OF INVENTION

Technical Problem

In the conventional art, the leakage magnetic flux is shielded by covering the sides and the other end face of the coils thereof using the shield box with only exposing an end face of the power-receiving coil and the power-supplying coil (opposing surface). However, space between the power-receiving coil and the power-supplying coil is not covered by the shield. Therefore, there is a problem in the conventional art that leakage magnetic flux that is emitted from the space between the power-receiving coil and the power-supplying coil to the periphery thereof. In particular, when the power-receiving coil is provided at the bottom of the electric vehicle and the power-supplying coil is buried in the ground, space between the coils thereof would be wider by an amount equal to the vehicle height. Therefore, the leakage magnetic flux is likely to be emitted to the environment.

The present invention is conceived in view of the above-described circumstances and it is an object thereof to reduce leakage magnetic flux emitted to the environment so as to be less than in the conventional art.

In order to solve the above-described problem, a wireless power supply system according to a first aspect of the present invention is provided with a power-supplying device having a power-supplying coil and a power-receiving device having a power-receiving coil, and supplies electric power wirelessly from the power-supplying coil to the power-receiving coil. The wireless power supply system includes a cover that is provided at least at one of the power-supplying device and the power-receiving device and that shields leakage magnetic flux by covering the periphery of the power-supplying coil and the power-receiving coil and a periphery of the space between the coils.

According to a second aspect of the present invention in the above-described first aspect the wireless power supply system is provided with a gas supply and exhaust mechanism. The cover is expandable and sealed. The gas supply and exhaust mechanism, when electric power is supplied, inflates the cover by supplying gas inside of the cover and establishes a shielding state from outside the cover where the inflated cover covers the periphery of the power-supplying coil and the power-receiving coil as well as the periphery of the space between the coils. The gas supply and exhaust mechanism deflates the cover and cancels the shielding state by exhausting gas from inside the cover when electric power is not supplied.

According to a third aspect of the present invention, in the above-described first or second aspect, a material is disposed at a portion of the cover located between the power-supplying coil and the power-receiving coil. The material has a higher magnetic permeability than the other portions.

According to a fourth aspect of the present invention, in one of the above-described first to third aspects, the power-receiving device is a vehicle that charges received electric power to a battery and the vehicle is driven by electric power stored in the battery.

According to the present invention, it is possible to reduce or shield the leakage magnetic flux emitted from the power-supplying coil, from the power-receiving coil and from the space between the power-supplying coil and power-receiving coil to the environment, since the wireless power supply space constituting the periphery of the power-supplying coil and the power-receiving coil and the space between said coils are covered by the cover when electric power is supplied. Therefore, it is possible to reduce the leakage magnetic flux emitted from the wireless power supply space constituting the power-supplying coil, the power-receiving coil and the space between the coils. The leakage magnetic flux means magnetic flux that does not directly or indirectly reach own or other coil ends from the end of the power-supplying coil and the power-receiving coil. The wireless power supply space is space where electromagnetic field is formed by the magnetic flux emitted from an end portion of the power-supplying coil and the power-receiving coil. A cover includes a covering, a wrapping, a lid, an umbrella or the like, made of a material that is impermeable to gas and fluid, or includes the equivalent of these.

FIG. 1 is a block diagram showing the functional structure of a wireless power supply system according to an embodiment of the present invention.

DESCRIPTION OF EMBODIMENTS

Figure 2A:
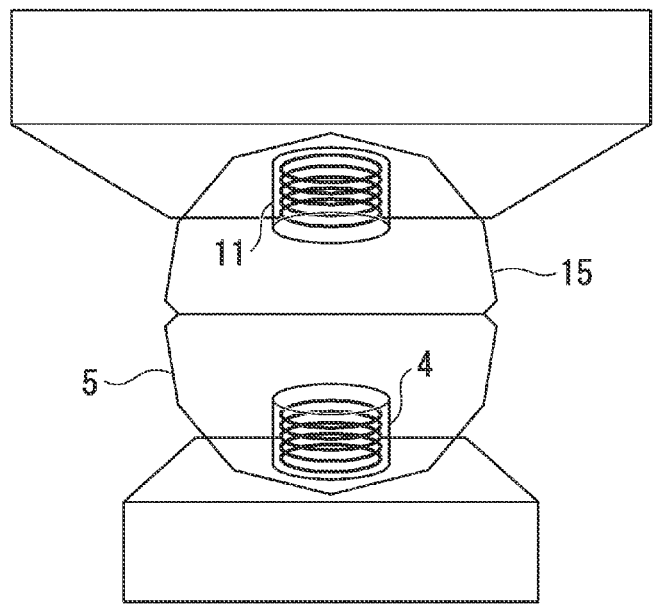
FIG. 2A is a view showing a state in which a power-supplying cover and a power-receiving cover inflate and contact with each other according to an embodiment of the present invention.

Hereinafter, an embodiment of the present invention will be described in detail with reference to the drawings. A wireless power supply system A according to an embodiment of the present invention, as shown in FIG. 1, is provided with a ground power-supplying device S and a vehicle M to which electric power is supplied from the ground power-supplying device S. The wireless power supply system A supplies electric power from the ground power-supplying device S to the vehicle M on the basis of magnetic resonance that is one type of wireless power supply methods.

The ground power-supplying device S is buried, for example, at stops in road intersection or train crossing, or at parking position or the like in the parking, and wirelessly supplies electric power to the vehicle M parked in a parking position. The ground power-supplying device S, as shown in FIG. 1, is provided with a power source 1, a rectifier circuit 2, a power-supplying circuit 3, a power-supplying coil 4, a power-supplying cover 5, a power-supplying gas supply and exhaust mechanism 6 and a power-supplying controller 7.

The power source 1 is an AC electric power supply whose output terminal is connected to an input terminal of the rectifier circuit 2 and supplies AC power to the rectifier circuit 2 that is required to supply power to the vehicle M. The power source 1 is a power supply system that supplies, for example, a three-phase AC power of 200V or 400V or a single-phase AC power of 100V. The input terminal of the rectifier circuit 2 is connected to the power source 1 and the output terminal of the rectifier circuit 2 is connected to the power-supplying circuit 3. The rectifier circuit 2 rectifies the AC power supplied from the power source 1 and converts it to a DC power, and outputs the DC power to the power-supplying circuit 3.

An input terminal of the power-supplying circuit 3 is connected to the rectifier circuit 2, and an output terminal of the power-supplying circuit 3 is connected to both ends of the power-supplying coil 4. The power-supplying circuit 3 is provided with a resonance capacitor, which constitutes the power-supplying side resonance circuit together with the power-supplying coil 4. The power-supplying circuit 3 is a kind of inverter that converts the DC power supplied from the rectifier circuit 2 to the AC power (high-frequency power) having a higher frequency than the AC power of the power source 1, and supplies it to the power-supplying coil 4 based on the control command input from the power-supplying controller 7.

The power-supplying coil 4 is a helical coil or a solenoid coil having a predetermined coil diameter. The power-supplying coil 4 is installed in the parked position as described above, for example, in a posture in which the coil axis is aligned in the up-and-down direction (vertical direction), and in a state of being molded with a non-magnetic material such as a plastic, a fiber reinforced plastic, a ceramic, or a composite thereof or the like. The power-supplying coil 4 is connected to an output end of the power-supplying circuit 3 at both ends thereof and wirelessly supplies power to the vehicle M through magnetic field generated by supplying high-frequency power from the power-supplying circuit 3. The power-supplying coil 4 may be in a posture where the coil axis is in horizontal direction or may be inclined at an angle, as far as it is magnetically coupled.

Figure 2B:
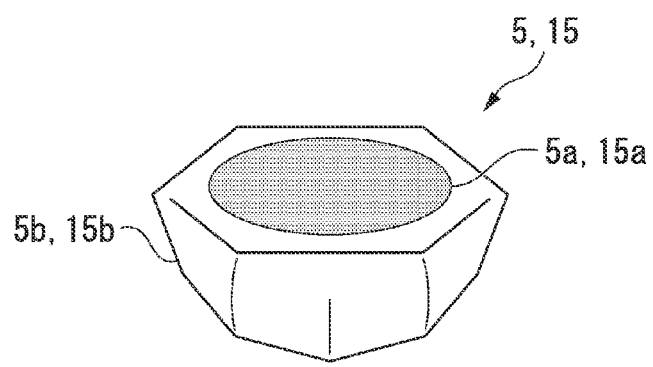
FIG. 2B is a view showing a contact surface in which a power-supplying cover and a power-receiving cover inflate and contact with each other according to an embodiment of the present invention.
Figure 2C:
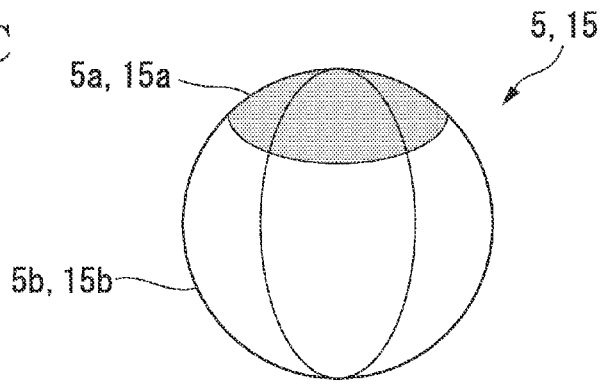
FIG. 2C is a view showing a state in which a power-supplying cover and a power-receiving cover inflate and do not contact with each other according to an embodiment of the present invention.

The power-supplying cover 5 is a kind of balloon of bag shape formed from a film of expandable elastic material such as rubber and installed on the ground in a state of enclosing the power-supplying coil 4. The power-supplying cover 5 is sealed and inflated over the periphery of the power-supplying coil 4 if gas (for example, air) is supplied from the power-supplying gas supply and exhaust mechanism 6, as shown in FIG. 2A. Further, in the power-supplying cover 5, as shown in FIG. 2B, a portion of the contact surface covering power-receiving coil 11 side of the power supplying coil 4 is formed as magnetic flux transmitting portion 5a in an inflated state. In the power-supplying cover 5, a portion other than the magnetic flux transmitting portion 5a is formed as magnetic flux shielding portion 5b in the inflated state. Further, if it does not contact, the power-supplying cover 5 and a power-receiving cover 15 are inflated as shown in FIG. 2C.

The magnetic flux transmitting portion 5a is formed by depositing or mixing with powders of high magnetic permeability material such as ferrite on the surface and inside of a membrane-like elastic material as the base material. The magnetic flux transmitting portion 5a may have both permeability for magnetic flux and expandability, but a contact portion may not necessarily be expanded. The magnetic flux shielding portion 5b is formed with being deposited or mixed with paramagnetic powders consisting of the magnetic flux shielding material such as aluminum or copper powder on the surface and inside of the film-like elastic material as the base material. The magnetic flux shielding portion 5b has both shielding performance for the magnetic flux and expandability.

The power-supplying gas supply and exhaust mechanism 6 is a kind of pump that supplies gas into the power-supplying cover 5 and exhausts gas from the power-supplying cover 5 in response to the control command input from the power-supplying controller 7. The power-supplying controller 7 is a software-based control device comprising a microprocessor and memory, which works following a predetermined power-supplying control program. The power-supplying controller 7 controls the power-supplying circuit 3 and the power-supplying gas supply and exhaust mechanism 6. Details of the processing of the power-supplying controller 7 will be described later in the explanation of operation.

A vehicle M is a car that travels on a road by being operated by a driver, and is, for example, an electric vehicle or a hybrid vehicle that runs by electric power as a power source. As shown in FIG. 1, the vehicle M has the power-receiving coil 11, a power-receiving circuit 12, a charging circuit 13, a battery 14, the power-receiving cover 15, and a power-receiving gas supply and exhaust mechanism 16 and power-receiving controller 17. Although not shown in FIG. 1, a vehicle M is equipped with components such as an engine, a travel motor, a steering wheel, and a brake and the like that are required to travel. The vehicle M may not necessarily use electric power as a power source for traveling, but can supply electric power to electric devices of the vehicle.

The power-receiving coil 11 is a helical coil or a solenoid coil having a coil diameter substantially the same as the power-supplying coil 4 of the ground power-supplying device S. The power-receiving coil 11 is provided at the bottom of the vehicle M in the posture where magnet coupling with the power-supplying coil 4 is possible, for example, the coil axis being the up-and-down direction (in vertical direction). The power-receiving coil 11 is connected to the input terminal of the power-receiving circuit 12 at both ends. Magnetic field from the power-supplying coil 4 induces voltage across the power-receiving coil 11 by magnetic resonance or by electromagnetic induction, and power-receiving coil 11 outputs the voltage to the power-receiving circuit 12. The power-receiving coil 11 may be in a posture where the coil axis is in horizontal direction or may be inclined at an angle, as far as it is magnetically coupled.

An input terminal of the power-receiving circuit 12 is connected to both ends of the power-receiving coil 11 and an output terminal of the power-receiving circuit 12 is connected to an input terminal of a charging circuit 13. The power-receiving circuit 12 is provided with a resonance capacitor, which constitutes the power-receiving side resonance circuit together with the power-receiving coil 11. The power-receiving circuit 12 is a kind of rectifier circuit and converts to DC power the AC power supplied from the power-receiving coil 11, and supplies the DC power to the charging circuit 13. It should be noted that capacitance of the resonance capacitor of the power-receiving circuit 12 is set so that the resonance frequency of the power-supplying side resonance circuit and that of the power-receiving side resonance circuit matches.

An input terminal of the charging circuit 13 is connected to the output terminal of the power-receiving circuit 12 and an output terminal of the charging circuit 13 is connected to an input terminal of the battery 14, and the charging circuit 13 charges electric power (DC power) to the battery 14 supplied from the power-receiving circuit 12. The battery 14 is a rechargeable battery (for example, a lithium ion battery, a nickel metal hydride battery or another type of secondary battery) equipped in the vehicle M, and the battery 14 supplies driving power to a driving motor or the like (figure not shown).

The power-receiving cover 15 is a kind of balloon of bag shape formed from a film of expandable elastic material such as rubber as in the power-supplying cover 5 as described above, and the power-receiving cover 15 is disposed at the bottom of the vehicle M in a state of enclosing the power-receiving coil 11. The power-receiving cover 15 is sealed and inflates over the periphery of the power-receiving coil 11 as shown in FIG. 2A when gas (for example, air) is supplied from the power-receiving gas supply and exhaust mechanism 16. Further, as shown in FIG. 2B, a portion locating under an end face (lower face) of the power-receiving coil 11 is formed as a magnetic flux transmitting portion 15a of the power-receiving cover 15 in the inflated state. A part other than the magnetic flux transmitting portion 15a of the power-receiving cover 15 is formed as the magnetic flux shielding portion 15b in the inflated state.

The magnetic flux transmitting portion 15a is formed by depositing or mixing with powders of high magnetic permeability material such as ferrite on the surface and inside of a membrane-like elastic material as the base material, similar to the magnetic flux transmitting portion 5a of the power-supplying cover 5 described above. The magnetic flux transmitting portion 15a may have both permeability performance for magnetic flux and expandability, but the magnetic flux transmitting portion 15a may not expand.

The magnetic flux shielding portion 15b is formed by depositing or mixing with paramagnetic powders composed of magnetic flux shielding material such as aluminum or copper powder on the surface and inside of a membrane-like elastic material as the matrix similar to the magnetic flux shielding portion 5b of the power-supplying cover 5 described above. The magnetic flux shielding portion 15b has both shielding performance for magnetic flux and expandability.

The power-receiving gas supply and exhaust mechanism 16 is a kind of pump that supplies gas into the power-receiving cover 15 and exhausts gas from the power-receiving cover 15 in response to the control command input from the power-receiving controller 17. The power-receiving controller 17 is a software-based control device that includes a microprocessor, memory and so on, and functions following a predetermined power-receiving control program. The power-receiving controller 17 controls the charging circuit 13 and the power-receiving gas supply and exhaust mechanism 16. Details of the processing of the power-supplying controller 7 will be described later in the explanation of operation.

Then, an operation of the wireless power supply system A that is configured will be explained. First, an operation of a vehicle M and the ground power-supplying device S when power supply is stopped will be explained. The power-receiving cover 15, if inflated, interferes with the running of the vehicle M when power supply is stopped (for example, at the time of normal driving of the vehicle M by a user). To prevent such a situation, the power-receiving controller 17 of the vehicle M makes the power-receiving gas supply and exhaust mechanism 16 exhaust gas from the power-receiving cover 15 so that the power-receiving cover 15 contracts completely. In addition, the power-receiving controller 17 stops the charging circuit 13. On the other hand, the power-supplying controller 7 of the ground power-supplying device S stops the power-supplying circuit 3 when power supply is stopped (that is, when the vehicle M which is a power supply target does not stop at the parked position). At the same time, the power-supplying controller 7 makes the power-supplying gas supply and exhaust mechanism 6 exhaust gas from inside of the power-supplying cover 5 so that the power-supplying cover 5 contracts completely.

Then, a user drives the vehicle M, moves the vehicle M to an installation location of the ground power-supplying device S, and stops the vehicle M. The power-receiving controller 17 of the vehicle M judges the installation position of the ground power-supplying device S from the output of a position sensor (figure not shown) such as an ultrasonic sensor or an optical sensor and so on. The power-receiving controller 17 detects that the vehicle M has moved to above the ground power-supplying device S by the output of the position sensor such as an ultrasonic sensor or an optical sensor and so on as described above. The power-receiving controller 17 makes the power-receiving gas supply and exhaust mechanism 16 supply gas so that the power-receiving cover 15 inflates and contacts the power-supplying cover 5 as shown in FIG. 2A and in FIG. 2B. In addition, then, the power-receiving controller 17 makes the charging circuit 13 start preparing a charging operation. Internal pressure of the power-receiving cover 15 is monitored by a pressure sensor (figure not shown), and the power-receiving controller 17 makes the charging circuit 13 start the charging operation if the power-receiving cover 15 contacts at a predetermined pressure.

The power-supplying controller 7 of the ground power-supplying device S judges the position of the vehicle M from the output of the position sensor (figure not shown) such as an ultrasonic sensor or an optical sensor and so on in the same way as the vehicle M. The power-supplying controller 7 detects that the vehicle M has moved and stopped to above the ground power-supplying device S through the output of the position sensor such as an ultrasonic sensor or an optical sensor and so on.

The power-supplying controller 7 makes the power-supplying gas supply and exhaust mechanism 6 supply gas so that the power-supplying cover 5 inflates and contacts the power-receiving cover 15. In addition, then, the power-supplying controller 7 makes the power-supplying circuit 3 start preparing a charging operation of power supply to the battery 14. Internal pressure of the power-receiving cover 15 is monitored by a pressure sensor (figure not shown), and the power-receiving controller 17 is able to make the charging circuit 13 start the charging operation if the power-receiving cover 15 contacts at a predetermined pressure.

In addition, it is also possible to adjust the frequency of high-frequency power that supply power by checking the contact state and the distance and the relative position between the power-supplying coil and the power-receiving coil by measuring the amount of gas supply and internal pressure of the cover. Note that it is confirmed whether the electric power can be supplied or not by checking the contact state of the cover by the pressure of the gas inside of the cover and the gas supply amount.

By the operation above, as shown in FIG. 2A and FIG. 2B, the power-supplying cover 5 of the ground power-supplying device S and the power-receiving cover 15 of the vehicle M contact each other in a state where the magnetic flux transmitting portion 5a and the magnetic flux transmitting portion 15a contact each other. That is, the magnetic flux transmitting portion 5a and the magnetic flux transmitting portion 15a are disposed between a magnetic flux end surface of the power-supplying coil 4 and a magnetic flux end surface of the power-receiving coil 11 which are magnetically coupled. On the other hand, the magnetic flux shielding portion 5b is disposed in a peripheral surface (side) of the power-transmitting coil 4, and the magnetic flux shielding portion 15b is disposed in a peripheral surface (side) of the power-receiving coil 11.

In the state explained above, high-frequency power is supplied from the power-supplying circuit 3 to the power-supplying coil 4. When the high-frequency power is supplied, the magnetic flux (main magnetic flux) emitted from an end face of the power-supplying coil 4 enters an end face of the power-receiving coil 11 through the magnetic flux transmitting portion 5a and the magnetic flux transmitting portion 15a, and resonates. Magnetic flux emitted from both ends of each coil couples and resonates in the power-supplying cover 5 and in the power-receiving cover 15 through the magnetic flux transmitting portion 5a and the magnetic flux transmitting portion 15a. On the other hand, magnetic flux (leakage magnetic flux) emitted from an end face of the power-supplying coil 4 and the power-receiving coil 11 is shielded and leakage of the magnetic flux to the outside of the power-supplying cover 5 and the power-receiving cover 15 is reduced by the magnetic flux shielding portion 5b and the magnetic flux shielding portion 15b.

The power-receiving controller 17 of the vehicle M controls the charging circuit 13 and properly charges the battery 14 by monitoring the state of charging of the battery 14. After that, the power receiving controller 17 detects a state in which the battery 14 is fully charged. The power-receiving controller 17 cancels the above-mentioned contact state by controlling the power-receiving gas supply and exhaust mechanism 16 and completely deflates the power-receiving cover 15. The power-receiving controller 17 stops the control of the power-supplying circuit 3 and completely deflates the power-supplying cover 5 by controlling the power-supplying gas supply and exhaust mechanism 6. Then, a user moves from the location of the ground power-supplying device S by driving the vehicle M when a fully charged state is recognized by an indicator and so on (figure not shown). Meanwhile, the power-supplying controller 7 of the ground power-supplying device S detects moving of the vehicle M by an output of the position sensor (figure not shown) such as an ultrasonic sensor or an optical sensor and so on.

According to the present embodiment, leakage magnetic flux of the power-supplying coil 4 to the outside of the power-supplying cover 5 and the power-receiving cover 15 is prevented by the magnetic flux shielding portion 5b and the magnetic flux shielding portion 15b. As a result, it is possible to reduce the leakage magnetic flux than the conventional art. Also, according to the present embodiment, the magnetic flux transmitting portion 5a and the magnetic flux transmitting portion 15a are disposed between the magnetic flux end surface of the power-supplying coil 4 and the magnetic flux end surface of the power-receiving coil 11. Thus it is possible to reduce the magnetic resistance against the main magnetic flux. As a result, it is possible to improve transmission efficiency of high-frequency power over the conventional art. Furthermore, according to the present embodiment, space between the power-supplying coil 4 and the power-receiving coil 11 is occupied by the power-supplying cover 5 and the power-receiving cover 15. Therefore, it is possible to completely prevent a foreign object from entering between the power-supplying coil 4 and the power-receiving coil 11 during power supply. Note that, contact state of the covers is confirmed by gas supply amount and pressure of gas inside of each cover, and it is possible to confirm that power could not be supplied if the contact state is abnormal by a foreign object in the cover when the cover is inflated Furthermore, according to the present embodiment, a magnetic resonance-type system is adopted for power transmission between the ground power-supplying device S and the vehicle M. The magnetic resonance-type system has a strong resistance against a position displacement (can tolerate a position displacement) of the power-supplying coil 4 and the power-receiving coil 11 compared with an electromagnetic induction system, and is able to realize a weak magnetic field, high efficiency and long-distance power transmission. Therefore, according to the present embodiment, as compared to a device adopting an electromagnetic induction system, a positioning mechanism with high precision is not required (sufficient for the generic position sensor such as an ultrasonic sensor or an optical sensor and so on described above). As a result, it is possible to achieve power transmission between the ground power-supplying device S and the vehicle M at low cost.

The embodiment of the present invention is described above, but the present invention is not limited to the above embodiment, and modifications such as the following can be considered.

Figure 3:
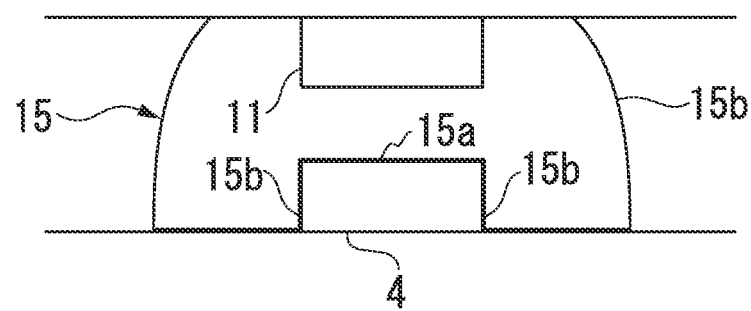
FIG. 3 is a view showing a variant example according to an embodiment of the present invention.

(1) In the embodiment above, the power-supplying cover 5 is provided at the ground power-supplying device S and the power-receiving cover 15 is provided at the vehicle M, but the present invention is not limited thereto. For example, the power-supplying cover 5 or the power-receiving cover 15 may be provided at one of the ground power-supplying device S or the vehicle M, and a single cover may cover the power-supplying coil 4 and the power-receiving coil 11. For example, FIG. 3 shows an exemplification that the power-receiving cover 15 is provided only in a vehicle M. That is, the power-receiving cover 15 not only encloses the power-receiving coil 11 but also covers the power-supplying coil 4 by inflation. In this case, as shown in FIG. 3, the magnetic flux transmitting portion 15a of the power-receiving cover 15 is in contact with the magnetic flux end surface of the power-supplying coil 4. Magnetic coupling is maintained by covering the magnetic flux end face even in a horizontal direction.

(2) In the case described above, the jamming transition phenomenon may be utilized. That is, the power-receiving cover 15 is filled with powder by supplying gas and powder to inside of the power-receiving cover 15 and the power-supplying coil 4 is covered by inflating the power-receiving cover 15. Then, powder in the power-receiving cover 15 behaves like solid by evacuating only gas inside of the power-receiving cover 15. In this state, powder is solidified in a state that covers the power-supplying coil 4 and the power-receiving coil 11. Therefore, it is possible to fix the position of the power-receiving coil 11 relative to the power-supplying coil 4.

(3) Furthermore, as a cover having a shape different from the above embodiments in addition to those shown in FIG. 3, a cover may consist only of the elastic resilient material such as silicone rubber or the like, and the magnetic flux transmitting portion 5a and the magnetic flux transmitting portion 15a, having high permeability for magnetic flux, are not disposed between the power-supplying coil 4 and the power-receiving coil 11. That is, a portion that corresponds to the magnetic flux transmitting portion 5a and the magnetic flux transmitting portion 15a is formed only from the base material and may cover the periphery of the power-supplying and the power-receiving coils 4, 11 and space between the power-supplying and the power-receiving coils 4, 11.

(4) In the above embodiment, the power-supplying device is the ground power-supplying device S which is buried in the ground, and the power-receiving device is the vehicle M that travels on the ground. The present invention is not limited thereto. For example, the power-supplying device is an underwater power-supplying device which is installed underwater, and the power-receiving device is an underwater vehicle which moves in the water. Furthermore, when an underwater vehicle investigates water quality and so on, a water quality data has to be taken outside from the underwater vehicle. In this case, a communication antenna may be provided inside of the power-supplying cover 5 of the underwater power-supplying device and the power-receiving cover 15 of the underwater vehicle, and the water quality data may be taken out through the communication antenna. That is, the underwater power-supplying device may be wire-connected to the water quality data management device on the ground through a communication cable, and the underwater vehicle may make wireless transmission of the water quality data to the underwater power-supplying device through the communication antenna during power-transmission (while the battery 14 is charged), and the underwater power-supplying device may make wired transmission of water quality data received from the underwater vehicle through the communication antenna to the water quality data management device. Further, a fluid that is supplied to inside of the cover may be liquid other than gas. In case of a magnetic resonance system in particular, a type of liquid may be ionic salt water, distilled water and alcohol and so on that does not damage the coil and the cover. A balance of a power-supplying device and a power-receiving device is able to be adjusted by a combination with gas, since the specific gravity of gas and liquid are very different.

(5) In the above embodiment, the magnetic resonance system is adopted as a wireless power supply method, but an electromagnetic induction system may be adopted.

(6) In the above embodiment, the power-supplying cover 5 and the power-receiving cover 15 are inflated only when power is supplied, and the power-supplying cover 5 and the power-receiving cover 15 are deflated when power is not supplied. The present invention is not limited thereto. The power-supplying cover 5 and the power-receiving cover 15 may be inflated when power is not supplied, as long as a travel of the vehicle M is not interfered. In this case, the power-supplying gas supply and exhaust mechanism 6 and the power-receiving gas supply and exhaust mechanism 16 can be omitted.

(7) In the above embodiment, the power-supplying cover 5 and the power-receiving cover 15 have, when inflated, a substantially hemispherical or substantially spherical shape with corners, but the shape thereof when inflated is not limited. In this case, a portion of a cover may be formed, instead of a film-shaped elastic member, from combination of an elastic member with a low elastic member or with a non-elastic member, so as to form a circular truncated cone or cuboid shape.

INDUSTRIAL APPLICABILITY

According to the present invention, leakage magnetic flux emitted from a power-supplying coil and a power-receiving coil and a wireless power supply space between coils to periphery is shielded, and the leakage magnetic flux is reduced than in the conventional arts.

DESCRIPTION OF REFERENCE SIGNS

A . . . wireless power supply system
S . . . ground power-supplying device
M . . . vehicle
1 . . . power source
2 . . . rectifier circuit
3 . . . power-supplying circuit
4 . . . power-supplying coil
5 . . . power-supplying cover
6 . . . power-supplying gas supply and exhaust mechanism
7 . . . power-supplying controller
11 . . . power-receiving coil
12 . . . power-receiving circuit
13 . . . charging circuit
14 . . . battery
15 . . . power-receiving cover
16 . . . power-receiving gas supply and exhaust mechanism
17 . . . power-receiving controller
5a, 15a . . . Magnetic flux transmitting portion
5b, 15b . . . Magnetic flux shielding portion

The invention claimed is:
1. A wireless power supply system that wirelessly supplies electric power from a power-supplying coil to a power-receiving coil, the system comprising:
a power-supplying device having the power-supplying coil and a power-receiving device having the power-receiving coil,
an inflatable and expandable cover provided at least at one of the power-supplying device and the power-receiving device,
wherein when inflated, the expandable cover shields leakage magnetic flux by covering a periphery of the power-supplying coil and the power-receiving coil and a periphery of space between the coils.
2. The wireless power supply system according to claim 1, wherein
the cover is sealed, and
the wireless power supply system further comprises a gas supply and exhaust mechanism that, when electric power is supplied, inflates the cover by supplying gas to inside of the cover and establishes a shielding state from outside the cover where the inflated cover covers the periphery of the power-supplying coil and the power-receiving coil and the periphery of the space between the coils, and that, when the electric power is not supplied, deflates the cover by exhausting gas from inside the cover and cancels the shielding state.

3. The wireless power supply system according to claim 1, wherein a material is disposed at a portion of the cover located between the power-supplying coil and the power-receiving coil, the material having a higher magnetic permeability than other portions.

4. The wireless power supply system according to claim 1, wherein the power-receiving device is a vehicle that charges received electric power to a battery and the vehicle is driven by electric power stored in the battery.

* * * * *